(12) United States Patent  (10) Patent No.: US 12,557,269 B2
Kim et al.  (45) Date of Patent: Feb. 17, 2026

(54) SEMICONDUCTOR DEVICE

(71) Applicant: SK hynix Inc., Gyeonggi-do (KR)

(72) Inventors: Dong Soo Kim, Gyeonggi-do (KR);
Yoon Jae Nam, Gyeonggi-do (KR);
Mun Gi Sim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 439 days.

(21) Appl. No.: 18/354,648

(22) Filed: Jul. 19, 2023

(65) Prior Publication Data

US 2024/0224506 A1   Jul. 4, 2024

(30) Foreign Application Priority Data

Dec. 29, 2022   (KR) .................. 10-2022-0188614

(51) Int. Cl.
*H10B 12/00*    (2023.01)
(52) U.S. Cl.
CPC .......... *H10B 12/34* (2023.02); *H10B 12/053* (2023.02)

(58) Field of Classification Search
CPC ...... H10B 12/053; H10B 12/34; H10B 30/63; H10B 64/513; H10B 64/662; H10B 64/667
See application file for complete search history.

(56) References Cited

U.S. PATENT DOCUMENTS

| 8,710,583 | B2 | 4/2014 | Ananthan et al. |
| 9,748,248 | B2 | 8/2017 | Kang |
| 10,147,727 | B2 | 12/2018 | Goswami et al. |
| 2022/0415793 | A1* | 12/2022 | Kim ................. H01L 23/5226 |

\* cited by examiner

*Primary Examiner* — Hoai V Pham
(74) *Attorney, Agent, or Firm* — IP & T GROUP LLP

(57) ABSTRACT

A semiconductor device includes: a substrate including a trench; a bottom gate electrode suitable for gap-filling a lower portion of the trench and including a silicon-doped first metal nitride; and a top gate electrode formed over the bottom gate electrode, and including a silicon-doped second metal nitride having a higher silicon content than a silicon content of the bottom gate electrode and having a higher ratio of a metal content to a nitrogen content than a ratio of a metal content to a nitrogen content of the bottom gate electrode.

22 Claims, 7 Drawing Sheets

US 12,557,269 B2

SEMICONDUCTOR DEVICE

CROSS-REFERENCE TO RELATED APPLICATIONS

The present application claims priority of Korean Patent Application No. 10-2022-0188614, filed on Dec. 29, 2022, which is incorporated herein by reference in its entirety.

BACKGROUND

1. Field

Embodiments of the present disclosure relate generally to a semiconductor technology and, more particularly, to a semiconductor device including a buried gate.

2. Description of the Related Art

High performance transistors employ a metal gate electrode. In particular, a buried gate-type transistor requires controlling a threshold voltage control for a high-performance operation. Also, gate-induced drain leakage (GIDL) characteristics have a great influence on the performance of a buried gate type transistor.

SUMMARY

Embodiments of the present disclosure are directed to a semiconductor device with improved electronic characteristics.

In accordance with an embodiment of the present disclosure, a semiconductor device includes: a substrate including a trench; a bottom gate electrode suitable for gap-filling a lower portion of the trench and including a silicon-doped first metal nitride; and a top gate electrode formed over the bottom gate electrode, and including a silicon-doped second metal nitride having a higher silicon content than a silicon content of the bottom gate electrode and having a higher ratio of a metal content to a nitrogen content than a ratio of a metal content to a nitrogen content of the bottom gate electrode.

In accordance with another embodiment of the present disclosure, a semiconductor device includes: a substrate including a trench; a bottom gate electrode suitable for gap-filling a lower portion of the trench; and a top gate electrode formed over the bottom gate electrode, and including a silicon-doped metal nitride having a higher metal content than a nitrogen content.

In accordance with another embodiment of the present disclosure, a semiconductor device includes: a substrate including a trench; a bottom gate electrode suitable for gap-filling a lower portion of the trench and including a silicon-doped first metal nitride having a silicon content of greater than 0% and less than 1%; and a top gate electrode formed over the bottom gate electrode and including a second metal nitride having a lower work function than a work function of the bottom gate electrode.

In accordance with another embodiment of the present disclosure, a semiconductor device including a buried gate structure, the buried gate structure includes: a bottom gate electrode; and a top gate electrode formed over the bottom gate electrode, wherein the top gate electrode comprises a first top gate electrode and a second top gate electrode, the first top gate electrode being disposed between the bottom gate electrode and the second top gate electrode; wherein the bottom gate electrode includes a silicon-doped first metal nitride; and wherein at least one of the first top gate electrode and the second top gate electrode includes a silicon-doped second metal nitride having a higher silicon content than a silicon content of the bottom gate electrode and having a higher ratio of a metal content to a nitrogen content than a ratio of a metal content to a nitrogen content of the bottom gate electrode.

DETAILED DESCRIPTION

Figure 1:
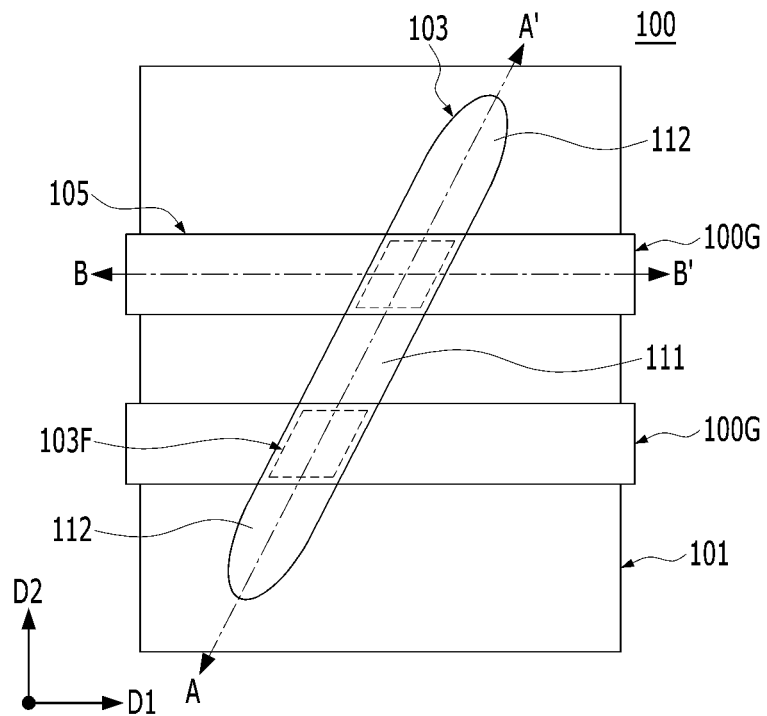
FIG. 1 is a plan view illustrating a semiconductor device in accordance with embodiments of the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
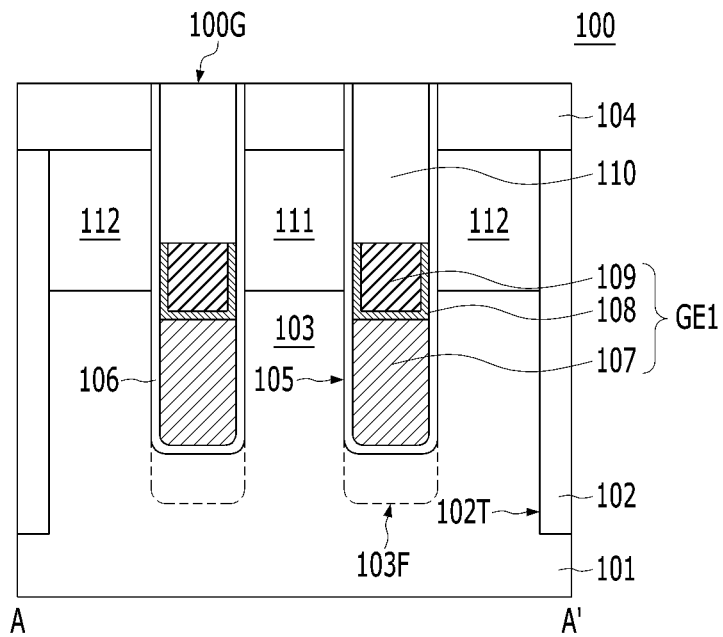
FIG. 2A is a cross-sectional view illustrating a semiconductor device taken along a line A-A' of FIG. 1 in accordance with a first embodiment of the present disclosure.
Figure 2B:
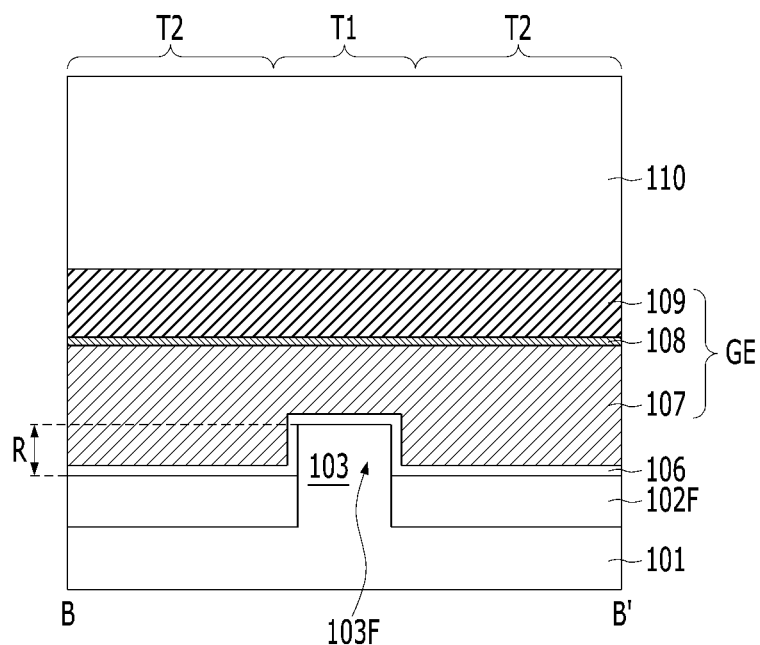
FIG. 2B is a cross-sectional view illustrating the semiconductor device taken along a line B-B' of FIG. 1 in accordance with the first embodiment of the present disclosure.

FIG. 1 is a plan view illustrating a semiconductor device in accordance with embodiments of the present disclosure. FIG. 2A is a cross-sectional view illustrating a semiconductor device taken along a line A-A' of FIG. 1 in accordance with a first embodiment of the present disclosure. FIG. 2B is a cross-sectional view illustrating the semiconductor device taken along a line B-B' of FIG. 1 in accordance with the first embodiment of the present disclosure.

Referring to FIGS. 1, 2A, and 2B, the semiconductor device 100 in accordance with the first embodiment may include a substrate 101 and a buried gate structure 100G embedded in the substrate 101. The semiconductor device 100 may be part of a memory cell. For example, the semiconductor device 100 may be part of a Dynamic Random Access Memory (DRAM) memory cell.

The substrate 101 may be made of a material appropriate for semiconductor processing. The substrate 101 may include a semiconductor substrate. The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include other semiconductor materials, such as germanium. The substrate 101 may include a III/V-group semiconductor substrate, for example, a compound semiconductor substrate, such as GaAs. The substrate 101 may include a silicon-on-insulator (SOI) substrate.

An isolation layer 102 and an active region 103 may be formed in the substrate 101. The active region 103 may be defined by the isolation layer 102. The isolation layer 102 may be a shallow trench isolation region (STI) which is formed by a trench etching process. The isolation layer 102 may be formed by filling a shallow trench, for example, an isolation trench 102T with dielectric material, such as, for example, silicon oxide, silicon nitride, or a combination thereof.

A plurality of trenches 105 may be formed spaced apart from each other at a regular interval in a second direction D2 in the substrate 101. Each of the trenches 105 may be formed by etching the substrate 101 using a hard mask layer 104 as an etch barrier. From a perspective of a plan view of FIG. 1, each trench 105 may have a line shape extending in a first direction D1. The trench 105 may have a line shape crossing the active region 103 and the isolation layer 102. The trench 105 may have a shallower depth than the isolation trench 102T. The trench 105 may have a flat bottom surface with curvature at the corners. According to another embodiment of the present disclosure, the bottom surface of the trench 105 may have a curvature. The trench 105 may be a space in which a buried gate structure 100G is formed and it may be referred to as a 'gate trench'.

A first doped region 111 and a second doped region 112 may be formed in the active region 103 and be spaced apart from each other. The first doped region 111 and the second doped region 112 may be regions that are doped with a conductive dopant. For example, the conductive dopant may include phosphorus (P), arsenic (As), antimony (Sb), or boron (B). The first doped region 111 and the second doped region 112 may be doped with dopants of the same conductivity type. The first doped region 111 and the second doped region 112 may be positioned in the active region 104 on opposite sides of each of the trenches 105. The bottom surfaces of the first doped region 111 and the second doped region 112 may be positioned at a predetermined depth from the top surface of the active region 103. The bottom surfaces of the first doped region 111 and the second doped region 112 may be at a higher level than the bottom surface of the trenches 105. The first doped region 111 may be referred to as a 'first source/drain region', and the second doped region 112 may be referred to as a 'second source/drain region'. A channel may be defined between the first doped region 111 and the second doped region 112 below the buried gate structure 100G. The channel may be defined along the profile of the trench 105.

The trenches 105 may include first trenches T1 and second trenches T2. The first trenches T1 may be formed in the active region 103. The second trenches T2 may be formed in the isolation layer 102. The trenches 105 may continuously extend from the first trenches T1 to the second trenches T2. In each of the trenches 105, the bottom surface of the first trench T1 may be positioned at a higher level than the bottom surface of the second trench T2. The height difference between the first trench T1 and the second trench T2 may be formed as the isolation layer 102 is recessed. Accordingly, the second trench T2 may include a recess region R having a lower bottom surface than the bottom surface of the first trench T1. A fin 103F may be formed in the active region 103 due to the step formed between the first trench T1 and the second trench T2. As a result, the active region 103 may include the fin 103F.

In this way, the fin 103F may be formed below the first trench T1, and the sidewall of the fin 103F may be exposed by the recessed isolation layer 102F. The fin 103F may be a portion in which a portion of a channel is formed. The fin 103F may be referred to as a saddle fin. The fin 103F may increase the channel width and improve electrical characteristics.

According to another embodiment of the present disclosure, the fin 103F may be omitted.

The buried gate structure 100G may include a gate dielectric layer 106 covering internal surfaces of a bottom wall and side walls of the trench 105, a gate electrode structure GE1 and a capping layer 110. The gate electrode structure GE1 and the capping layer 110 are sequentially stacked inside the trench 105 to filling the remaining space of the trench 105 that is not taken by the dielectric layer 106. The gate electrode structure GE1 and the capping layer 110 are formed over the gate dielectric layer 106 to fill the trench 105. The gate electrode structure GE1 and the capping layer 110 are in direct contact with each other and with the gate dielectric layer 106. The gate dielectric layer 106 forms a uniform thickness layer on the internal surfaces of the trench 105.

The gate dielectric layer 106 may include silicon oxide, silicon nitride, silicon oxynitride, a high-k material, or a combination thereof. The high-k material may include a material having a higher dielectric constant than that of silicon oxide. For example, the high-k material may include a material having a greater dielectric constant than approximately 3.9. For another example, the high-k material may include a material having a greater dielectric constant than approximately 10. For yet another example, the high-k material may include a material having a dielectric constant of approximately 10 to 30. The high-k material may include at least one metallic element. The high-k material may include a hafnium-containing material. The hafnium-containing material may include hafnium oxide, hafnium silicon oxide, hafnium silicon oxynitride, or a combination thereof. According to another embodiment of the present disclosure, the high-k material may include lanthanum oxide, lanthanum aluminum oxide, zirconium oxide, zirconium silicon oxide, zirconium silicon oxynitride, aluminum oxide, or a combination thereof. As for the high-k material, other known high-k materials may be selectively used. The gate dielectric layer 106 may include a metal oxide.

The top surface of the gate electrode structure GE1 may be positioned at a lower level than the top surface of the active region 103. The gate electrode structure GE1 may include a stacked structure of a bottom gate electrode 107 and a top gate electrode 108. The bottom gate electrode 107 and the top gate electrode may include a metal nitride containing the same metal.

The bottom gate electrode 107 may fill the lower portion of the trench 105 over the gate dielectric layer 106. The bottom gate electrode 107 may include a silicon-doped first metal nitride. The bottom gate electrode 107 may include a silicon-doped first metal nitride having a ratio of a metal content to a nitrogen content of 1 or more. The bottom gate electrode 107 may include a silicon-doped first metal nitride having a ratio of a metal content to a nitrogen content of 1 or more and a silicon content of greater than 0% and less than 1%. For example, the silicon-doped first metal nitride may include silicon-doped titanium nitride.

The top gate electrode may fill the middle portion of the trench 105 over the bottom gate electrode 107. The top gate electrode may include a stacked structure of the first top gate electrode 108 and the second top gate electrode 109. The top gate electrode may include a silicon-doped second metal nitride having a higher silicon content than the bottom gate electrode 107 and a higher ratio of the metal content to the nitrogen content than the ratio of the metal content to the nitrogen content of the bottom gate electrode 107. The top gate electrode may include a stacked structure of a first top gate electrode 108 of a liner type and a second top gate electrode 109 of a bulk type whose bottom and side surfaces are covered by the first top gate electrode 108. The thickness of the first top gate electrode 108 may be adjusted to 10 Å to 30 Å, but the concept and spirit of the present disclosure are not limited thereto. The top surfaces of the first top gate electrode 108 and the second top gate electrode 109 may be positioned at the same level. The top surface of the first top gate electrode 108 may be positioned at a higher level than the bottom surfaces of the first and second doped regions 111 and 112. In other words, the first top gate electrode 108 may partially overlap with the first and second doped regions 111 and 112 in the horizontal direction (which is a direction parallel to the top surface of the substrate).

The first top gate electrode 108 may include a material having a lower work function than that of the bottom gate electrode 107. The first top gate electrode 108 may have a higher silicon content than the bottom gate electrode 107, and may be a silicon doped second metal nitride having a higher ratio of the metal content to the nitrogen content than the ratio of the metal content to the nitrogen content of the bottom gate electrode 107. The silicon-doped second metal nitride may include a silicon-doped second metal nitride having a silicon content of 1% or more and less than 5%. The silicon-doped second metal nitride may have a higher ratio of a crystal grain direction <100> to a crystal grain direction <111> than that of the bottom gate electrode 107. For example, the silicon-doped second metal nitride may include silicon-doped titanium nitride.

The second top gate electrode 109 may be formed of a lower resistance material than that of the first top gate electrode 108. The second top gate electrode 109 may include the same material as that of the bottom gate electrode 107. The second top gate electrode 109 may include a silicon-doped first metal nitride. The second top gate electrode 109 may include, for example, titanium nitride or molybdenum.

The capping layer 110 may fill the upper portion of the trench 105 over the second top gate electrode 109. The capping layer 110 may include a dielectric material. For example, the capping layer 110 may include silicon nitride, silicon oxide, silicon oxynitride, or a combination thereof.

According to the embodiment of the present disclosure, the terms like the lower portion, the middle portion, and the upper portion of the trench 105 are used for the sake of convenience in explanation, and the thickness (or depth) of each of the lower portion, the middle portion, and the upper portion of the trench 105 may be the same or different from each other.

According to the embodiment of the present disclosure, by forming the bottom gate electrode 107, the first top gate electrode 108, and the second top gate electrode 109 of a metal-based material, the volume of the metal in the gate electrode may be increased. Thus, the resistance Rs of a word line may be improved. Also, since the first top gate electrode 108 adjacent to the first and second doped regions 111 and 112 is formed of a low work function material, an effect of preventing gate-induced drain leakage (GIDL) may be obtained.

Figure 3:
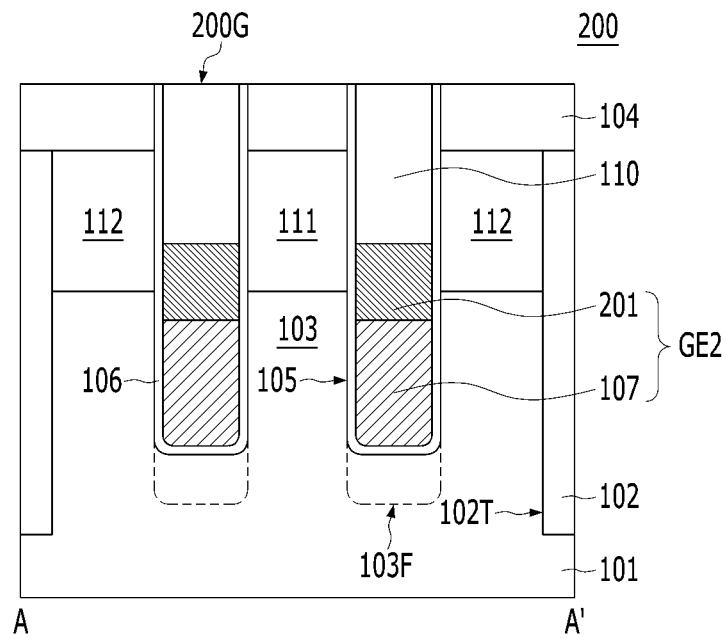
FIGS. 3 to 13 are cross-sectional views illustrating semiconductor devices in accordance with second to $12^{th}$ embodiments of the present disclosure.

FIG. 3 illustrates a semiconductor device in accordance with a second embodiment of the present disclosure. FIG. 3 may include the same constituent elements as those of FIG. 2A except for a top gate electrode. In other words, the substrate 101, the isolation layer 102, the active region 103, the hard mask layer 104, the gate dielectric layer 106, the capping layer 110, the first doped region 111 and the second doped region 112 that are shown in FIG. 3 may have the same material and structure as those of FIG. 2A, and a detailed description on them will be omitted herein.

Referring to FIG. 3, the semiconductor device 200 in accordance with a second embodiment of the present disclosure may include a substrate 101 and a buried gate structure 200G which is embedded in the substrate 101.

The buried gate structure 200G may include a gate dielectric layer 106 that covers the surface of the bottom wall and sidewalls of the trench 105, a gate electrode structure GE2 and a capping layer 110. The capping layer 110 is stacked over the gate electrode structure GE2. The gate dielectric layer 106 forms a uniform thickness layer over the surface of the bottom wall and sidewalls of the trench 105, and the capping layer 110 and the gate electrode structure GE2 to fill the remaining space of the trench that is not taken by the gate dielectric layer 106. The capping layer 110 is stacked over the gate electrode structure and over gate dielectric layer 106. The gate electrode structure GE2 may include a stacked structure of a bottom gate electrode 107 and a top gate electrode 201. The bottom gate electrode 107 may fill the lower portion of the trench 105 over the gate dielectric layer 106. The top gate electrode 201 may be formed over the bottom gate electrode 107 and may fill the middle portion of the trench 105. The capping layer 110 may fill the upper portion of the trench 105 over the top gate electrode 201. The terms like the lower portion, the middle portion, and the upper portion of the trench 105 are used for the sake of convenience in explanation, and the thickness (or depth) of each of the lower portion, the middle portion, and the upper portion of the trench 105 may be the same or different from each other.

The top surface of the gate electrode structure GE2 may be positioned at a lower level than the top surface of the active region 103. The gate electrode structure GE2 may include a stacked structure of the bottom gate electrode 107 and the top gate electrode 201. The top surface of the bottom gate electrode 107 may be positioned at a lower level than the bottom surfaces of first and second doped regions 111 and 112. The top surface of the top gate electrode 201 may be positioned at a higher level than the bottom surfaces of the first and second doped regions 111 and 112. In other words, the top gate electrode 201 may partially overlap with the first and second doped regions 111 and 112 in the horizontal direction (which is a direction parallel to the top surface of the substrate).

The bottom gate electrode 107 may fill the lower portion of the trench 105 over the gate dielectric layer 106. The bottom gate electrode 107 may include a silicon-doped first metal nitride. The bottom gate electrode 107 may include a silicon-doped first metal nitride having a ratio of a metal content to a nitrogen content of 1 or more. The bottom gate electrode 107 may include a silicon-doped first metal nitride having a ratio of the metal content to the nitrogen content of 1 or more and a silicon content of greater than 0% and less than 1%. For example, the silicon-doped first metal nitride may include a silicon-doped titanium nitride.

The top gate electrode 201 may have a higher silicon content than the bottom gate electrode 107, and the top gate electrode 201 may include a silicon doped second metal nitride having a higher ratio of the metal content to the nitrogen content than the ratio of the metal content to the nitrogen content of the bottom gate electrode 107. The top gate electrode 201 may include a material having a lower work function than that of the bottom gate electrode 107. The top gate electrode 201 may have a higher silicon content than the bottom gate electrode 107, and the top gate electrode 201 may be a silicon-doped second metal nitride having a higher ratio of the metal content to the nitrogen content than the ratio of the metal content to the nitrogen content of the bottom gate electrode 107. The silicon-doped second metal nitride may include a silicon-doped second metal nitride having a silicon content of 1% or more and less than 5%. In the silicon-doped second metal nitride, the ratio of a grain direction <100> to a grain direction <111> may be higher than that of the bottom gate electrode 107. For example, the silicon-doped second metal nitride may include silicon-doped titanium nitride.

FIGS. 4 to 12 are cross-sectional views illustrating semiconductor devices in accordance with third to 11$^{th}$ embodiments of the present disclosure. FIGS. 4 to 9 may include the same constituent elements as those of FIG. 2A except for the constituent elements of the gate electrode structure shown in each figure. In other words, a substrate 101, an isolation layer 102, an active region 103, a hard mask layer 104, a gate dielectric layer 106, a capping layer 110, a first doped region 111 and a second doped region 112 that are illustrated in FIGS. 4 to 9 may have the same material and structure as those shown in FIG. 2A. Thus, detailed description on them will be omitted herein.

Figure 4:
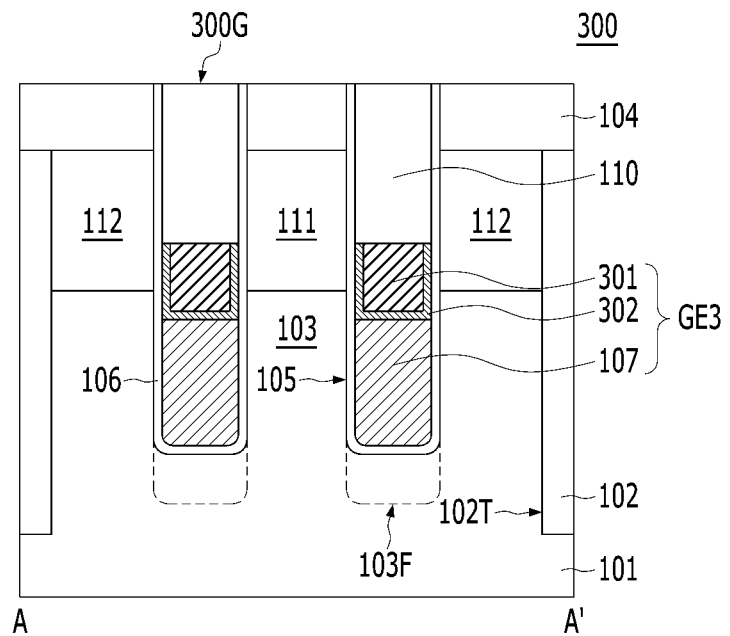

Referring to FIG. 4, a semiconductor device 300 in accordance with a third embodiment may include the same constituent elements as those of FIG. 2A except for a top gate electrode. The semiconductor device 300 may include a substrate 101 and a buried gate structure 300G embedded in the substrate 101.

The buried gate structure 300G may include a gate dielectric layer 106 that covers the surface of the bottom wall and sidewalls of the trench 105, a gate electrode structure GE3 and a capping layer 110. The capping layer 110 is stacked over the gate electrode GE3 and over the gate dielectric layer 106 to fill the trench 105.

The top surface of the gate electrode structure GE3 may be positioned at a lower level than the top surface of the active region 103. The gate electrode structure GE3 may include a stacked structure of the bottom gate electrode 107 and the top gate electrode 301 and 302. The bottom gate electrode 107 and the top gate electrode 301 and 302 may include a metal nitride containing the same metal.

The bottom gate electrode 107 may fill the lower portion of the trench 105 over the gate dielectric layer 106. The bottom gate electrode 107 may include a silicon-doped first metal nitride. The bottom gate electrode 107 may include a silicon-doped first metal nitride having a ratio of the metal content to the nitrogen content of 1 or more. The bottom gate electrode 107 may include a silicon-doped first metal nitride having a ratio of the metal content to the nitrogen content of 1 or more and a silicon content of greater than 0% and less than 1%. For example, the silicon-doped first metal nitride may include silicon-doped titanium nitride.

The top gate electrode 301 and 302 may fill the middle portion of the trench 105 over the bottom gate electrode 107. The top gate electrode 301 and 302 may include a stacked structure of a first top gate electrode 301 and a second top gate electrode 302. The top gate electrode 301 and 302 may include a second metal nitride having a lower work function than that of the bottom gate electrode 107. The top gate electrode 301 and 302 may include a stacked structure of the first top gate electrode 301 of a liner type and the second top gate electrode 302 of a bulk type whose bottom and side surfaces are covered by the first top gate electrode 301. The thickness of the first top gate electrode 301 may be adjusted to a range of to 10 Å to 30 Å, but the concept and spirit of the present disclosure are not limited thereto. The top surfaces of the first top gate electrode 301 and the second top gate electrode 302 may be positioned at the same level. The top surface of the first top gate electrode 301 may be positioned at a higher level than the bottom surfaces of the first and second doped regions 111 and 112. In other words, the first top gate electrode 301 may partially overlap with the first and second doped regions 111 and 112 in the horizontal direction (which is a direction parallel to the top surface of the substrate).

For example, the first top gate electrode 301 may include one selected from a group including phosphorus-doped titanium nitride (phosphorus-doped TiN), titanium-rich titanium nitride (titanium-rich TiN), titanium silicide nitride (TiSiN), and tantalum nitride (TaN).

The second top gate electrode 302 may include a lower resistance material than that of the first top gate electrode 301. The second top gate electrode 302 may include the same material as that of the bottom gate electrode 107. The second top gate electrode 302 may include a silicon-doped first metal nitride. The second top gate electrode 302 may include, for example, titanium nitride or molybdenum.

Figure 5:
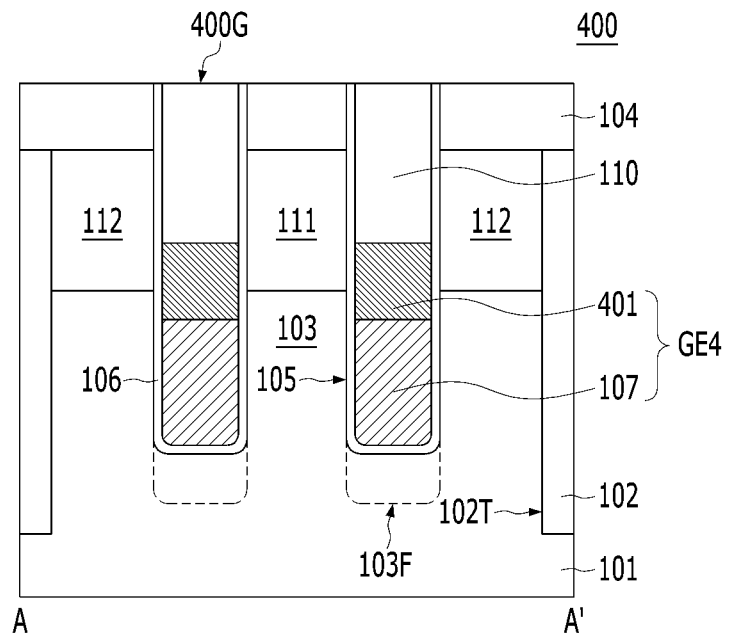

Referring to FIG. 5, a semiconductor device 400 in accordance with a fourth embodiment may include the same constituent elements as those of FIG. 2A except for a top gate electrode 401. The semiconductor device 400 may include a substrate 101 and a buried gate structure 400G which is embedded in the substrate 101.

The buried gate structure 400G may include a gate dielectric layer 106 that covers the surface of the bottom wall and sidewalls of the trench 105, a gate electrode structure GE4 and a capping layer 110. The capping layer 110 is stacked over the gate electrode structure GE4 and over the gate dielectric layer 106 to fill the trench 105. The gate electrode structure GE4 may include a stacked structure of a bottom gate electrode 107 and a top gate electrode 401. The bottom gate electrode 107 may fill the lower portion of the trench 105 over the gate dielectric layer 106. The top gate electrode 401 may be formed over the bottom gate electrode 107 and may fill the middle portion of the trench 105. The capping layer 110 may fill the upper portion of the trench 105 over the top gate electrode 401. The terms like the lower portion, the middle portion, and the upper portion of the trench 105 are used for the sake of convenience in explanation, and the thickness (or depth) of each of the lower portion, the middle portion, and the upper portion of the trench 105 may be the same or different from each other.

The top surface of the gate electrode structure GE4 may be positioned at a lower level than the top surface of the active region 103. The gate electrode structure GE4 may include a stacked structure of the bottom gate electrode 107 and the top gate electrode 401. The top surface of the bottom gate electrode 107 may be positioned at a lower level than the bottom surfaces of the first and second doped regions 111 and 112. The top surface of the top gate electrode 401 may be positioned at a higher level than the bottom surfaces of the first and second doped regions 111 and 112. In other words, the top gate electrode 401 may partially overlap with the first and second doped regions 111 and 112 in the horizontal direction (which is a direction parallel to the top surface of the substrate).

The bottom gate electrode 107 may fill the lower portion of the trench 105 over the gate dielectric layer 106. The bottom gate electrode 107 may include a silicon-doped first metal nitride. The bottom gate electrode 107 may include a silicon-doped first metal nitride having a ratio of the metal content to the nitrogen content of 1 or more. The bottom gate electrode 107 may include a silicon-doped first metal nitride having a ratio of the metal content to the nitrogen content of 1 or more and a silicon content of greater than 0% and less than 1%. For example, the silicon-doped first metal nitride may include silicon-doped titanium nitride.

The top gate electrode 401 may include a second metal nitride having a lower work function than that of the bottom gate electrode 107. For example, the top gate electrode 401 may include one selected from a group including phosphorus-doped titanium nitride (phosphorus-doped TiN), titanium-rich titanium nitride (titanium-rich TiN), titanium silicide nitride (TiSiN), and tantalum nitride (TaN).

Figure 6:
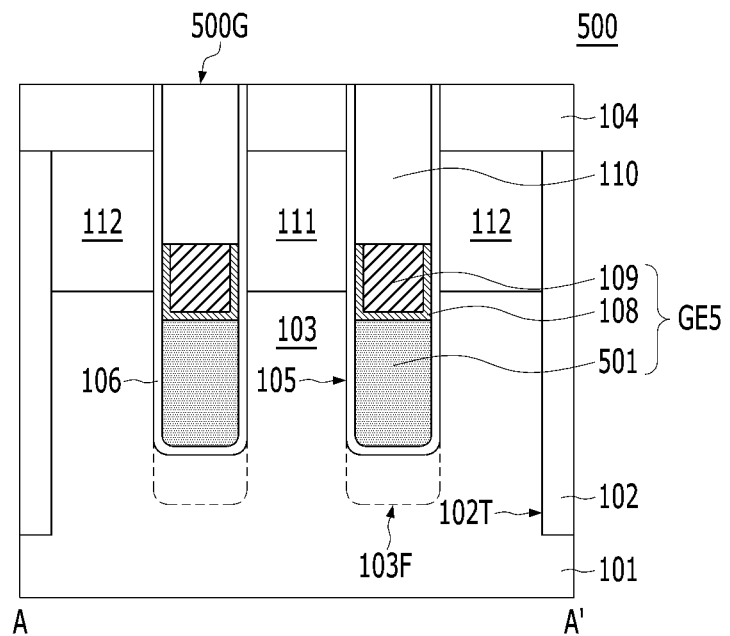

Referring to FIG. 6, a semiconductor device 500 in accordance with a fifth embodiment may include the same constituent elements as those of FIG. 2A except for a lower gate structure 501. The semiconductor device 500 may include a substrate 101 and a buried gate structure 500G embedded in the substrate 101.

The buried gate structure 500G may include a gate dielectric layer 106 that covers the surface of the bottom wall and sidewalls of the trench 105, a gate electrode structure GE5 and a capping layer 110. The capping layer 110 is stacked over the gate electrode structure and over the gate dielectric layer 106 to fill the trench 105.

The top surface of the gate electrode structure GE5 may be positioned at a lower level than the top surface of the active region 103. The gate electrode structure GE5 may include a stacked structure of a bottom gate electrode 501 and a top gate electrode 108 and 109. The bottom gate electrode 501 and the top gate electrode 108 and 109 may include a metal nitride containing the same metal.

The bottom gate electrode 501 may fill the lower portion of the trench 105 over the gate dielectric layer 106. The bottom gate electrode 501 may include a metal material. For example, the bottom gate electrode 501 may include molybdenum or ruthenium.

The top gate electrodes 108 and 109 may fill the middle portion of the trench 105 over the bottom gate electrode 501. The top gate electrode may include a stacked structure of a first top gate electrode 108 and a second top gate electrode 109. The top gate electrode may include a stacked structure of the first top gate electrode 108 of a liner type and the second top gate electrode 109 of a bulk type whose bottom and side surfaces are covered by the first top gate electrode 108. The thickness of the first top gate electrode 108 may be adjusted to 10 Å to 30 Å, but the concept and spirit of the present disclosure are not limited thereto. The top surfaces of the first top gate electrode 108 and the second top gate electrode 109 may be positioned at the same level. The top surface of the first top gate electrode 108 may be positioned at a higher level than the bottom surfaces of the first and second doped regions 111 and 112. In other words, the first top gate electrode 108 may partially overlap with the first and second doped regions 111 and 112 in the horizontal direction (which is a direction parallel to the top surface of the substrate).

The first top gate electrode 108 may include a silicon-doped metal nitride having a metal content higher than a nitrogen content. The first top gate electrode 108 may include a material having a lower work function than that of the bottom gate electrode 501. The silicon-doped metal nitride may have a silicon content of greater than 1% and less than 5%. For example, the silicon-doped metal nitride may include silicon-doped titanium nitride.

The second top gate electrode 109 may include a lower resistance material than that of the first top gate electrode 108. The second top gate electrode 109 may include the same material as that of the bottom gate electrode 501. The second top gate electrode 109 may include, for example, one selected from a group including titanium nitride, molybdenum, and ruthenium.

Figure 7:
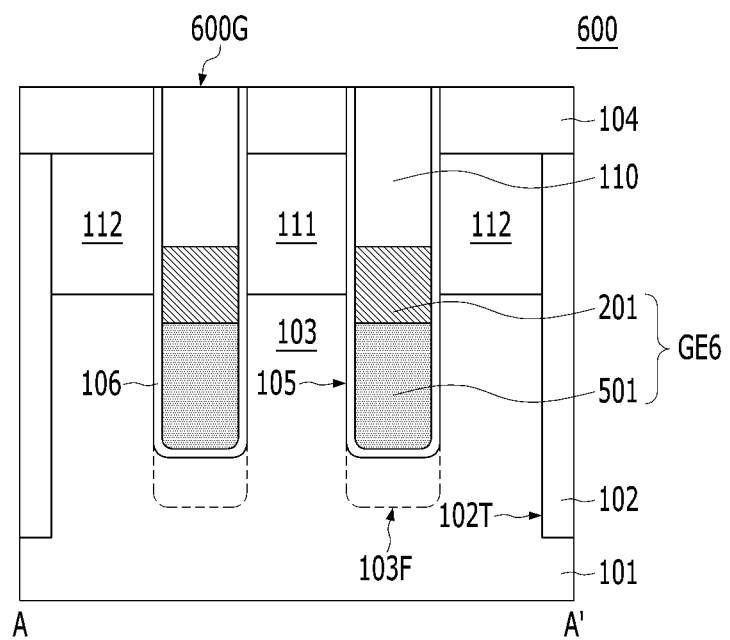

Referring to FIG. 7, a semiconductor device 600 in accordance with a sixth embodiment may include the same constituent elements as those of FIG. 3 except for the bottom gate electrode 501. The semiconductor device 600 may include a substrate 101 and a buried gate structure 600G embedded in the substrate 101.

The buried gate structure 600G may include a gate dielectric layer 106 that covers the surface of the bottom wall and sidewalls of the trench 105, a gate electrode structure GE6 and a capping layer 110. The capping layer 110 is stacked over the gate electrode structure GE6 and over the gate dielectric layer 106 to fill the trench 105. The gate electrode structure GE6 may include a stacked structure of a bottom gate electrode 501 and a top gate electrode 201. The bottom gate electrode 501 may fill the lower portion of the trench 105 over the gate dielectric layer 106. The top gate electrode 201 may be formed over the bottom gate electrode 501 and may fill the middle portion of the trench 105. The capping layer 110 may fill the upper portion of the trench 105 over the top gate electrode 201. The terms like the lower portion, the middle portion, and the upper portion of the trench 105 are used for the sake of convenience in explanation, and the thickness (or depth) of each of the lower portion, the middle portion, and the upper portion of the trench 105 may be the same or different from each other.

The top surface of the gate electrode structure GE6 may be positioned at a lower level than the top surface of the active region 103. The gate electrode structure GE6 may include a stacked structure of a bottom gate electrode 501 and a top gate electrode 201. The top surface of the bottom gate electrode 501 may be positioned at a lower level than the bottom surfaces of the first and second doped regions 111 and 112. The top surface of the top gate electrode 201 may be positioned at a higher level than the bottom surfaces of the first and second doped regions 111 and 112. In other words, the top gate electrode 201 may partially overlap with the first and second doped regions 111 and 112 in the horizontal direction (which is a direction parallel to the top surface of the substrate).

The bottom gate electrode 501 may fill the lower portion of the trench 105 over the gate dielectric layer 106. The bottom gate electrode 501 may include a metal material. For example, the bottom gate electrode 501 may include molybdenum or ruthenium.

The top gate electrode 201 may include a silicon-doped metal nitride having a metal content higher than a nitrogen content. The function than that of the bottom gate electrode 501. The silicon-doped metal nitride may have a silicon content of greater than 1% and less than 5%. For example, the silicon-doped metal nitride may include silicon-doped titanium nitride.

Figure 8:
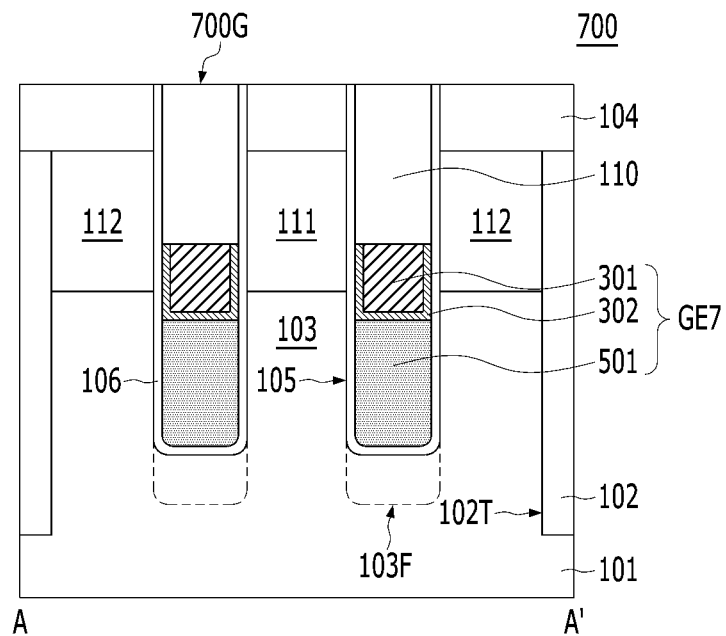

Referring to FIG. 8, a semiconductor device 700 in accordance with a seventh embodiment may include the same constituent elements as those of FIG. 4 except for the bottom gate electrode 501. The semiconductor device 700 may include a substrate 101 and a buried gate structure 700G embedded in the substrate 101.

The buried gate structure 700G may include a gate dielectric layer 106 that covers the surface of the bottom wall and sidewalls of the trench 105, a gate electrode structure GE7 and a capping layer 110. The capping layer 110 is stacked over the gate electrode structure GE7 and over the gate dielectric layer 106 to fill the trench 105.

The top surface of the gate electrode structure GE7 may be positioned at a lower level than the top surface of the active region 103. The gate electrode structure GE7 may include a stacked structure of a bottom gate electrode 501 and a top gate electrode. The bottom gate electrode 501 and the top gate electrode may include a metal nitride containing the same metal.

The bottom gate electrode 501 may fill the lower portion of the trench 105 over the gate dielectric layer 106. The bottom gate electrode 501 may include a metal material. For example, the bottom gate electrode 501 may include molybdenum or ruthenium.

The top gate electrode may fill the middle portion of the trench 105 over the bottom gate electrode 501. The top gate electrode may include a stacked structure of the first top gate electrode 301 and the second top gate electrode 302. The top gate electrode may include a metal nitride having a lower work function than that of the bottom gate electrode 501. The top gate electrode may include a stacked structure of a first top gate electrode 301 of a liner type and a second top gate electrode 302 of a bulk type whose bottom and side surfaces are covered by the first top gate electrode 301. The thickness of the first top gate electrode 301 may be adjusted to 10 Å to 30 Å, but the concept and spirit of the present disclosure are not limited thereto. The top surfaces of the first top gate electrode 301 and the second top gate electrode 302 may be positioned at the same level. The top surface of the first top gate electrode 301 may be positioned at a higher level than the bottom surfaces of the first and second doped regions 111 and 112. In other words, the first top gate electrode 301 may partially overlap with the first and second doped regions 111 and 112 in the horizontal direction (which is a direction parallel to the top surface of the substrate).

For example, the first top gate electrode 301 may include one selected from a group including phosphorus-doped titanium nitride (phosphorus-doped TiN), titanium-rich titanium nitride (titanium-rich TiN), titanium silicide nitride (TiSiN), and tantalum nitride (TaN).

The second top gate electrode 302 may include a lower resistance material than that of the first top gate electrode 301. The second top gate electrode 302 may include the same material as that of the bottom gate electrode 107. The second top gate electrode 302 may include a silicon-doped metal nitride. For example, the second top gate electrode 302 may include a silicon-doped titanium nitride. The second top gate electrode 302 may include, for example, titanium nitride or molybdenum.

Figure 9:
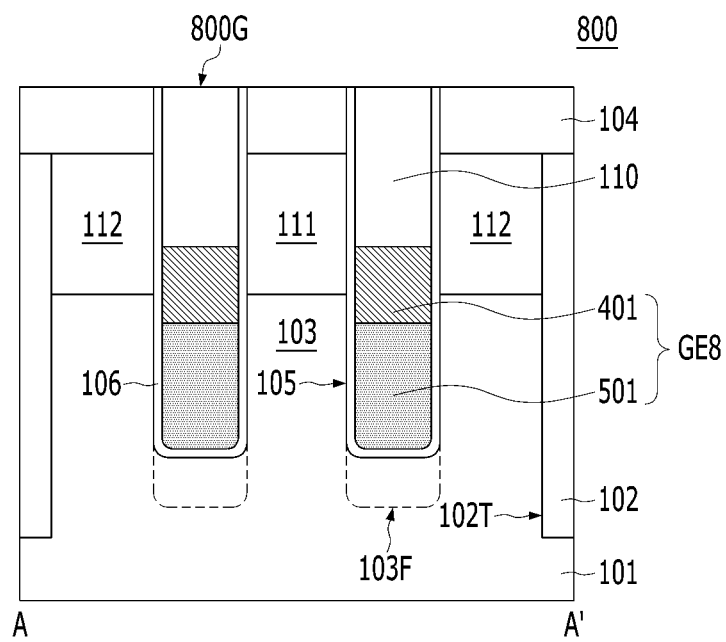

Referring to FIG. 9, a semiconductor device 800 in accordance with an eighth embodiment may include the same constituent elements as those of FIG. 5 except for the bottom gate electrode 501. The semiconductor device 800 may include a substrate 101 and a buried gate structure 800G embedded in the substrate 101.

The buried gate structure 800G may include a gate dielectric layer 106 that covers the surface of the bottom wall and sidewalls of the trench 105, a gate electrode structure GE8 and a capping layer 110. The capping layer 110 is stacked over the gate electrode structure GE8 and over the gate dielectric layer 106 to fill the trench 105. The gate electrode structure GE8 may include a stacked structure of a bottom gate electrode 501 and a top gate electrode 401.

The bottom gate electrode 501 may fill the lower portion of the trench 105 over the gate dielectric layer 106. The top gate electrode 401 may be formed over the bottom gate electrode 501 and may fill the middle portion of the trench 105. The capping layer 110 may fill the upper portion of the trench 105 over the top gate electrode 401. The terms like the lower portion, the middle portion, and the upper portion of the trench 105 are used for the sake of convenience in explanation, and the thickness (or depth) of each of the lower portion, the middle portion, and the upper portion of the trench 105 may be the same or different from each other.

The top surface of the gate electrode structure GE8 may be positioned at a lower level than the top surface of the active region 103. The gate electrode structure GE8 may include a stacked structure of a bottom gate electrode 501 and a top gate electrode 401. The top surface of the bottom gate electrode 501 may be positioned at a lower level than the bottom surfaces of the first and second doped regions 111 and 112. The top surface of the top gate electrode 401 may be positioned at a higher level than the bottom surfaces of the first and second doped regions 111 and 112. In other words, the top gate electrode 401 may partially overlap with the first and second doped regions 111 and 112 in the horizontal direction (which is a direction parallel to the top surface of the substrate).

The bottom gate electrode 501 may fill the lower portion of the trench 105 over the gate dielectric layer 106. The bottom gate electrode 501 may include a metal material. For example, the bottom gate electrode 501 may include molybdenum or ruthenium.

The top gate electrode 401 may include a metal nitride having a lower work function than that of the bottom gate electrode 501. For example, the top gate electrode 401 may include one selected from a group including phosphorus-doped titanium nitride (phosphorus-doped TiN), titanium-rich titanium nitride (titanium-rich TiN), titanium silicide nitride (TiSiN), and tantalum nitride (TaN).

Figure 10:
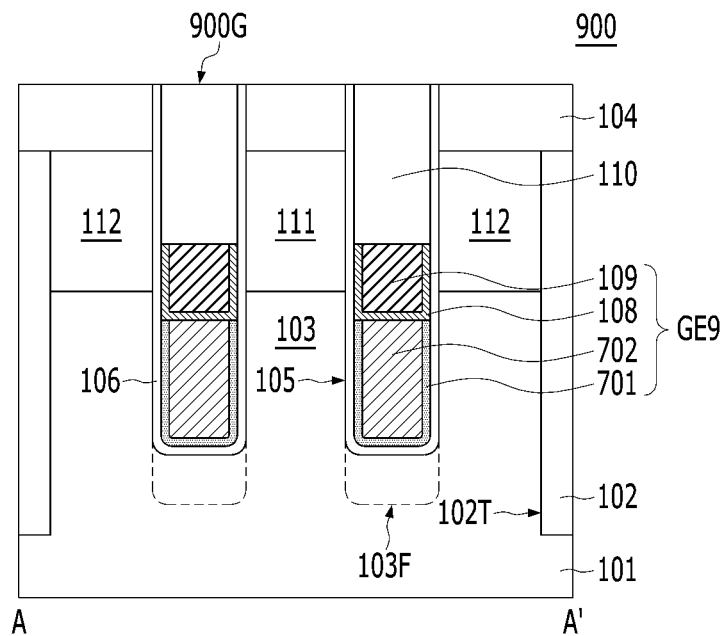

Referring to FIG. 10, a semiconductor device 900 in accordance with a ninth embodiment may include the same constituent elements as those as that of FIG. 2A except for a bottom gate electrode. The semiconductor device 900 may include a substrate 101 and a buried gate structure 900G embedded in the substrate 101.

The buried gate structure 900G may include a gate dielectric layer 106 that covers the surface of the bottom wall and sidewalls of the trench 105, a gate electrode structure GE9 and a capping layer 110. The capping layer 110 is stacked over the gate electrode structure GE9 and over the gate dielectric layer 106 to fill the trench 105.

The top surface of the gate electrode structure GE9 may be positioned at a lower level than the top surface of the active region 103. The gate electrode structure GE9 may include a stacked structure of a bottom gate electrode and a top gate electrode.

The bottom gate electrode 701 and 702 may fill the lower portion of the trench 105 over the gate dielectric layer 106. The bottom gate electrode 701 and 702 may include a stacked structure of a first bottom gate electrode 701 and a second bottom gate electrode 702. The bottom gate electrode may include a stacked structure of the first bottom gate electrode 701 of a liner type and the second bottom gate electrode 702 of a bulk type whose bottom and side surfaces are covered by the first bottom gate electrode 701. The top surfaces of the first and second bottom gate electrodes 701 and 701 may be positioned at the same level. The first bottom gate electrode 701 may include a metal nitride. For example, the first bottom gate electrode 701 may include molybdenum nitride or titanium nitride. The second bottom gate electrode 702 may include a metal material. For example, the second bottom gate electrode 702 may include molybdenum.

The top gate electrode may fill the middle portion of the trench 105 over the bottom gate electrode. The top gate electrode may include a stacked structure of a first top gate electrode 108 and a second top gate electrode 109. The top gate electrode may include a stacked structure of a first top gate electrode 108 of a liner type and a second top gate electrode 109 of a bulk type whose bottom and side surfaces are covered by the first top gate electrode 108. The thickness of the first top gate electrode 108 may be adjusted to 10 Å to 30 Å, but the concept and spirit of the present disclosure are not limited thereto. The top surfaces of the first top gate electrode 108 and the second top gate electrode 109 may be positioned at the same level. The top surface of the first top gate electrode 108 may be positioned at a higher level than the bottom surfaces of the first and second doped regions 111 and 112. In other words, the first top gate electrode 108 may partially overlap with the first and second doped regions 111 and 112 in the horizontal direction (which is a direction parallel to the top surface of the substrate).

The first top gate electrode 108 may include a silicon-doped metal nitride having a metal content higher than a nitrogen content. The first top gate electrode 108 may include a material having a lower work function than that of the bottom gate electrode. The silicon-doped metal nitride may have a silicon content of greater than 1% and less than 5%. For example, the silicon-doped metal nitride may include silicon-doped titanium nitride.

The second top gate electrode 109 may include a lower resistance material than that of the first top gate electrode 108. The second top gate electrode 109 may include the same material as that of the second bottom gate electrode 701. The second top gate electrode 109 may include, for example, one selected from a group including titanium nitride, molybdenum, and ruthenium.

Figure 11:
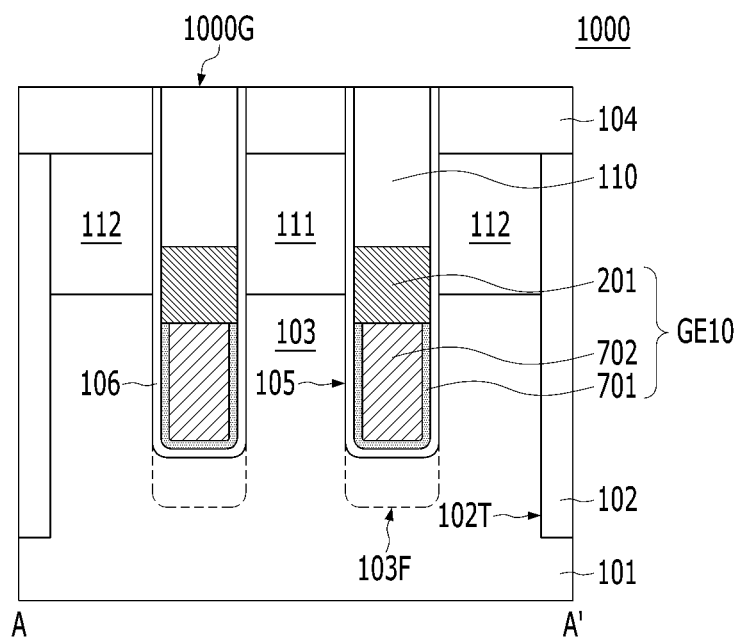

Referring to FIG. 11, a semiconductor device 1000 in accordance with a 10$^{th}$ embodiment may include the same constituent elements as those of FIG. 3 except for the lower gate structure. The semiconductor device 1000 may include a substrate 101 and a buried gate structure 1000G embedded in the substrate 101.

The buried gate structure 1000G may include a gate dielectric layer 106 that covers the surface of the bottom wall and sidewalls of the trench 105, a gate electrode structure electrode structure GE10 and a capping layer 110. The capping layer 110 is stacked over the gate electrode structure GE10 and over the gate dielectric layer 106 to fill the trench 105.

The top surface of the gate electrode structure GE10 may be positioned at a lower level than the top surface of the active region 103. The gate electrode structure GE10 may include a stacked structure of a bottom gate electrode and a top gate electrode.

The bottom gate electrode may fill the lower portion of the trench 105 over the gate dielectric layer 106. The bottom gate electrode may include a stacked structure of a first bottom gate electrode 701 and a second bottom gate electrode 702. The bottom gate electrode may include a stacked structure of a first bottom gate electrode 701 of a liner type and a second bottom gate electrode 702 of a bulk type whose bottom and side surfaces are covered by the first bottom gate electrode 701. The top surfaces of the first and second bottom gate electrodes 701 and 702 may be positioned at the same level. The first bottom gate electrode 701 may include a metal nitride. For example, the first bottom gate electrode 701 may include molybdenum nitride or titanium nitride. The second bottom gate electrode 702 may include a metal material. For example, the second bottom gate electrode 702 may include molybdenum.

The top gate electrode 201 may include a silicon-doped metal nitride having a metal content higher than a nitrogen content. The function than that of the bottom gate electrode 501. The silicon-doped metal nitride may have a silicon content of greater 1% and less than 5%. For example, the silicon-doped metal nitride may include silicon-doped titanium nitride.

Figure 12:
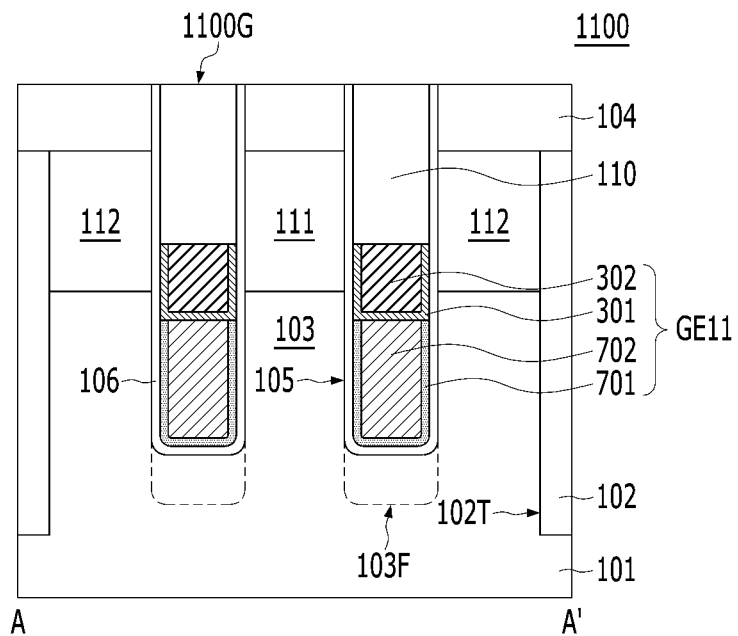

Referring to FIG. 12, a semiconductor device 1100 in accordance with an 11$^{th}$ embodiment may include the same constituent elements as those of FIG. 4 except for the bottom gate electrode. The semiconductor device 1100 may include a substrate 101 and a buried gate structure 1100G embedded in the substrate 101.

The buried gate structure 1100G may include a gate dielectric layer 106 that covers the surface of the bottom wall and sidewalls of the trench 105, a gate electrode structure electrode structure GE11 and a capping layer 110. The capping layer 110 is stacked over the gate electrode structure GE11 and over the gate dielectric layer 106 to fill the trench 105.

The top surface of the gate electrode structure GE11 may be positioned at a lower level than the top surface of the active region 103. The gate electrode structure GE11 may include a stacked structure of a bottom gate electrode and a top gate electrode.

The bottom gate electrode may fill the lower portion of the trench 105 over the gate dielectric layer 106. The bottom gate electrode may include a stacked structure of a first bottom gate electrode 701 and a second bottom gate electrode 702. The bottom gate electrode may include a stacked structure of a first bottom gate electrode 701 of a liner type and a second bottom gate electrode 702 of a bulk type whose bottom and side surfaces are covered by the first bottom gate electrode 701. The top surfaces of the first and second bottom gate electrodes 701 and 702 may be positioned at the same level. The first bottom gate electrode 701 may include a metal nitride. For example, the first bottom gate electrode 701 may include molybdenum nitride or titanium nitride. The second bottom gate electrode 702 may include a metal material. For example, the second bottom gate electrode 702 may include molybdenum.

The top gate electrode 301, 302 may fill the middle portion of the trench 105 over the bottom gate electrode. The top gate electrode 301 and 302 may include a stacked structure of a first top gate electrode 301 and a second top gate electrode 302. The top gate electrode may include a metal nitride having a lower work function than that of the bottom gate electrode. The top gate electrode may include a stacked structure of a first top gate electrode 301 of a liner type and a second top gate electrode 302 of a bulk type whose bottom and side surfaces are covered by the first top gate electrode 301. The thickness of the first top gate electrode 301 may be adjusted to 10 Å to 30 Å, but the concept and spirit of the present disclosure are not limited thereto. The top surfaces of the first top gate electrode 301 and the second top gate electrode 302 may be positioned at the same level. The top surface of the first top gate electrode 301 may be positioned at a higher level than the bottom surfaces of the first and second doped regions 111 and 112. In other words, the first top gate electrode 301 may partially overlap with the first and second doped regions 111 and 112 in the horizontal direction (which is a direction parallel to the top surface of the substrate).

For example, the first top gate electrode 301 may include one selected from a group including phosphorus-doped titanium nitride (phosphorus-doped TiN), titanium-rich titanium nitride (titanium-rich TIN), titanium silicide nitride (TiSiN), and tantalum nitride (TaN).

The second top gate electrode 302 may include a lower resistance material than that of the first top gate electrode 301. The second top gate electrode 302 may include the same material as that of the second bottom gate electrode 702. The second top gate electrode 302 may include a silicon-doped metal nitride. For example, the second top gate electrode 302 may include a silicon-doped titanium nitride. The second top gate electrode 302 may include, for example, titanium nitride or molybdenum.

Figure 13:
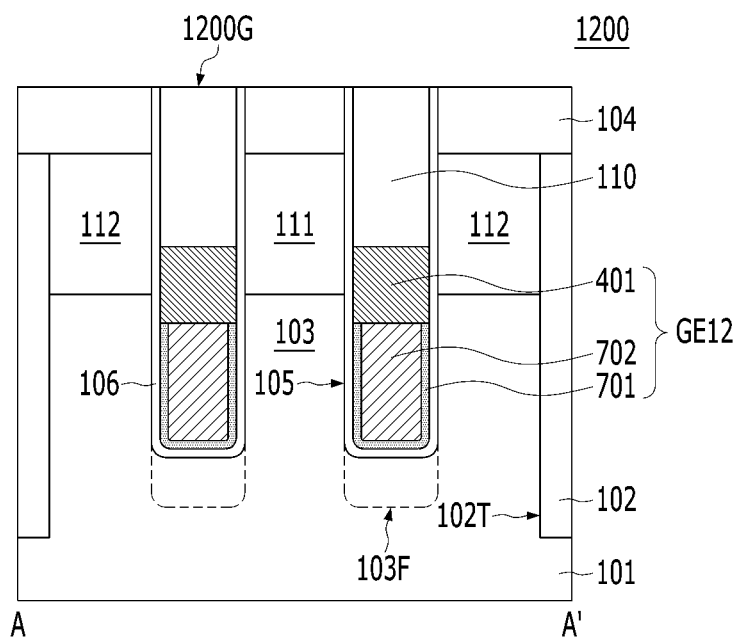

Referring to FIG. 13, a semiconductor device 1200 in accordance with a 12$^{th}$ embodiment may include the same constituent elements as those of FIG. 5 except for the lower gate structure. The semiconductor device 1200 may include a substrate 101 and a buried gate structure 1200G embedded in the substrate 101.

The buried gate structure 1200G may include a gate dielectric layer 106 that covers the surface of the bottom wall and sidewalls of the trench 105, a gate electrode structure GE12 and a capping layer 110. The capping layer 110 is stacked over the gate electrode structure GE12 and over the gate dielectric layer 106 to fill the trench 105.

The top surface of the gate electrode structure GE12 may be positioned at a lower level than the top surface of the active region 103. The gate electrode structure GE12 may include a stacked structure of a bottom gate electrode and a top gate electrode.

The bottom gate electrode 701, 702 may fill the lower portion of the trench 105 over the gate dielectric layer 106. The bottom gate electrode 701, 702 may include a stacked structure of a first bottom gate electrode 701 and a second bottom gate electrode 702. The bottom gate electrode may include a stacked structure of a first bottom gate electrode 701 of a liner type and a second bottom gate electrode 702 of a bulk type whose bottom and side surfaces are covered by the first bottom gate electrode 701. The top surfaces of the first and second bottom gate electrodes 701 and 702 may be positioned at the same level. The first bottom gate electrode 701 may include a metal nitride. For example, the first bottom gate electrode 701 may include molybdenum nitride or titanium nitride. The second bottom gate electrode 702 may include a metal material. For example, the second bottom gate electrode 702 may include molybdenum.

The top gate electrode 401 may include a metal nitride having a lower work function than that of the bottom gate electrode 501. For example, the top gate electrode 401 may include one selected from a group including phosphorus-doped titanium nitride (phosphorus-doped TiN), titanium-rich titanium nitride (titanium-rich TIN), titanium silicide nitride (TiSiN), and tantalum nitride (TaN).

According to embodiments of the present disclosure, the resistance of a word line may be reduced by applying a metal-based material as a buried gate electrode.

According to embodiments of the present disclosure, gate-induced drain leakage (GIDL) may be improved by adjusting the work functions of the top and bottom gate electrodes.

While the present disclosure has been described with respect to specific embodiments, it will be apparent to those skilled in the art that various changes and modifications may be made without departing from the spirit and scope of the invention as defined in the following claims.

What is claimed is:

1. A semiconductor device, comprising:
   a substrate including a trench;
   a bottom gate electrode suitable for gap-filling a lower portion of the trench and including a silicon-doped first metal nitride; and
   a top gate electrode formed over the bottom gate electrode, and including a silicon-doped second metal nitride having a higher silicon content than a silicon content of the bottom gate electrode and having a higher ratio of a metal content to a nitrogen content than a ratio of a metal content to a nitrogen content of the bottom gate electrode.

2. The semiconductor device of claim 1, wherein the silicon-doped first metal nitride has a silicon content of greater than 0% and less than 1%.

3. The semiconductor device of claim 1, wherein the ratio of the metal content to the nitrogen content of the silicon-doped first metal nitride is 1 or more.

4. The semiconductor device of claim 1, wherein the silicon-doped first metal nitride has:
   a ratio of a metal content to a nitrogen content of 1 or more, and
   a silicon content of greater than 0% and less than 1%.

5. The semiconductor device of claim 1, wherein the silicon-doped second metal nitride has a silicon content of greater than 1% and less than 5%.

6. The semiconductor device of claim 1, wherein the silicon-doped second metal nitride has a higher ratio of a crystal grain direction <100> to a crystal grain direction <111> than a higher ratio of a crystal grain direction <100> to a crystal grain direction <111> of the silicon-doped first metal nitride.

7. The semiconductor device of claim 1, wherein the silicon-doped first metal nitride and the silicon-doped second metal nitride include titanium nitride.

8. The semiconductor device of claim 1, wherein the top gate electrode includes:
   a first top gate electrode of a liner type and
   a second top gate electrode of a bulk type which is formed over the first top gate electrode and has bottom and side surfaces covered by the first top gate electrode.

9. The semiconductor device of claim 8, wherein the first top gate electrode is the silicon-doped second metal nitride.

10. The semiconductor device of claim 8, wherein the second top gate electrode includes a lower resistance material than the first top gate electrode.

11. The semiconductor device of claim 8, wherein the second top gate electrode includes the same material as a material of the bottom gate electrode.

12. The semiconductor device of claim 8, wherein the second top gate electrode includes titanium nitride or molybdenum.

13. A semiconductor device, comprising:
   a substrate including a trench;
   a bottom gate electrode suitable for gap-filling a lower portion of the trench; and
   a top gate electrode formed over the bottom gate electrode, and including a silicon-doped metal nitride having a higher metal content than a nitrogen content.

14. The semiconductor device of claim 13, wherein the silicon-doped metal nitride has a silicon content of greater than 1% and less than 5%.

15. The semiconductor device of claim 13, wherein the silicon-doped metal nitride has a ratio of a metal content to a nitrogen content of greater than 1, and
a silicon content of greater than 1% and less than 5%.

16. The semiconductor device of claim 13, wherein the silicon-doped metal nitride includes silicon-doped titanium nitride.

17. The semiconductor device of claim 13, wherein the top gate electrode includes:
a first top gate electrode of a liner type and
a second top gate electrode of a bulk type which is formed over the first top gate electrode and has bottom and side surfaces covered by the first top gate electrode.

18. The semiconductor device of claim 17, wherein the first top gate electrode is the silicon-doped metal nitride.

19. The semiconductor device of claim 17, wherein the second top gate electrode includes a lower resistance material than the first top gate electrode.

20. The semiconductor device of claim 17, wherein the second top gate electrode includes the same material as a material of the bottom gate electrode.

21. The semiconductor device of claim 17, wherein the second top gate electrode includes titanium nitride or molybdenum.

22. The semiconductor device of claim 13, wherein the bottom gate electrode includes:
a single layer structure or a stacked structure of one or more selected from a group including molybdenum, ruthenium, a stacked structure of molybdenum nitride and molybdenum, and a stacked structure of titanium nitride and molybdenum.

* * * * *